United States Patent
Jin

(10) Patent No.: US 10,148,274 B1
(45) Date of Patent: Dec. 4, 2018

(54) NON-LINEAR OVEN-CONTROLLED CRYSTAL OSCILLATOR COMPENSATION CIRCUIT

(71) Applicant: Microsemi Semiconductor ULC, Kanata (CA)

(72) Inventor: Qu Gary Jin, Kanata (CA)

(73) Assignee: Microsemi Semiconductor ULC, Kanata, ON (CA)

( * ) Notice: Subject to any disclaimer, the term of this patent is extended or adjusted under 35 U.S.C. 154(b) by 0 days.

(21) Appl. No.: 16/001,104

(22) Filed: Jun. 6, 2018

(51) Int. Cl.
| | |
|---|---|
| *H03L 7/18* | (2006.01) |
| *G04G 7/00* | (2006.01) |
| *H03L 7/14* | (2006.01) |
| *H03L 7/093* | (2006.01) |

(52) U.S. Cl.
CPC .............. *H03L 7/18* (2013.01); *G04G 7/02* (2013.01); *H03L 7/093* (2013.01); *H03L 7/148* (2013.01)

(58) Field of Classification Search
CPC ........... H03L 7/18; H03L 7/093; H03L 7/148; G04G 7/02
USPC .................................. 327/147–163; 375/376
See application file for complete search history.

(56) References Cited

U.S. PATENT DOCUMENTS

| | | | | |
|---|---|---|---|---|
| 6,711,230 | B1* | 3/2004 | Nicholls .................. | G04G 3/00 327/147 |
| 8,040,994 | B1* | 10/2011 | Patapoutian .......... | H03L 7/1075 327/151 |
| 2004/0208274 | A1* | 10/2004 | Abramovitch ............ | H03L 7/06 375/376 |
| 2011/0001524 | A1* | 1/2011 | Gendai ..................... | H03L 7/08 327/156 |

OTHER PUBLICATIONS

Jose Maria Castillo-Secilla, Jose Manuel Palomares, Joaquin Olivares; "Temperature-Compensated Clock Skew Adjustment"; Published 2013 on open access Sensors, ISSN 1424-8220, www.mdpi.com/journal/sensors.
Ha Yang Kim; "Modeling and Tracking Time-Varying Clock Drifts in Wireless Networks"; PhD Thesis Georgia Institute of Technology, Aug. 2014.

(Continued)

*Primary Examiner* — Thomas Skibinski
(74) *Attorney, Agent, or Firm* — Simon Kahn

(57) ABSTRACT

A compensation circuit for an oven-controlled crystal oscillator serving as a reference for a phase-locked loop in holdover mode is disclosed. A non-linear function module generates a modified aging signal that is a non-linear function of an aging signal. A first Kalman filter generates an estimate of the frequency drift of the crystal oscillator based on the temperature signal. A second Kalman filter generates an estimate of the frequency drift based on the modified aging signal. A combining and comparing module combines the estimates generated by the first and second Kalman filters and compares the estimates with detected frequency drift to produce an error signal to update the Kalman filters. In holdover mode the Kalman filters generate an error signal to correct the oscillator frequency based on updates obtained during operation of the phase-locked loop in normal mode.

20 Claims, 8 Drawing Sheets

(56) References Cited

OTHER PUBLICATIONS

Hui Zhou, Thomas Kunz, Howard Schwartz; "Adaptive Correction Method for an OXCO and Investigation of Analytical Cumulative Time Error Upperbound"; IEEE Transactions on Ultrasonics, Ferroelectrics, and Frequency Control, vol. 58, Issue: 1, Jan. 2011; IEEE New York, NY.
Hugo Fruehauf; ""g"-Compensated, Miniature, High Performance Quartz Crystal Oscillators"; Published Apr. 2007 by Frequency Electronics, Inc., Mitchel Field, Long Island, NY.
C.W.T.Nicholls and G.C.Carleton; "Adaptive OCXO Drift Correction Algorithm"; Published Aug. 2004, Proceedings of the 2004 IEEE International Frequency Control Symposium and Exposition, 2004, IEEE, New York, NY.

\* cited by examiner

NON-LINEAR OVEN-CONTROLLED CRYSTAL OSCILLATOR COMPENSATION CIRCUIT

FIELD OF THE INVENTION

This invention relates to the field of precision timing, and in particular to a circuit for compensating for frequency variation in oven-controlled crystal oscillators as a result of temperature and aging effects, especially for use as a back-up reference for digital phase-locked loops (DPLLs) in the event of a failure of the primary reference source.

BACKGROUND OF THE INVENTION

Modern communications systems, such as cell phone services, are heavily reliant on a precise timing reference. Typically, this is provided by a DPLL locked to a primary reference, such as a GPS signal. Occasionally the primary reference signal will be lost, in which case the DPLL goes into holdover mode wherein it is reliant on a precise local reference, which is typically an oven-controlled crystal oscillator (OXCO).

While oven-controlled crystal oscillators provide an extremely stable reference frequency, they are subject to drift over time due to variations in temperature and aging of the device.

U.S. Pat. No. 6,711,230, and the paper entitled Adaptive OCXO Drift Correction Algorithm, by C. W. T Nicholls and G. C. Carleton, given at the 2004 IEEE International Ultrasonics, Ferroelectrics, and Frequency Control Joint $50^{th}$ Anniversary Conference, the contents of which are herein incorporated by reference, describe a compensation circuit employing separate Kalman filters that are trained during normal PLL operation, and wherein the trained Kalman filters are used to control the output frequency of the oscillator in the holdover mode based on updates obtained during normal mode. The Kalman filters described in Nicholls assume that the frequency dependence on age is linear, or at least can be approximated by a linear model, with any departure from linearity being corrected by employing higher order polynomial terms within the Kalman filter.

Kalman filters are well known in the art and are typically used to extract data from a noisy environment where it is possible to model the physical behavior of a system. Unfortunately, the frequency dependence of an OXCO with age appears be logarithmic, and is thus not properly compensated over time.

SUMMARY OF THE INVENTION

Embodiments of the invention are based on the observation that the frequency dependence on age of an OCXO is at least initially a highly non-linear process and that significant improvements in oscillator performance can be achieved by basing the compensation circuit on a non-linear model, preferably a logarithmic aging model, wherein the aging signal is first passed through a non-linear module to obtain the input signal to a Kalman filter, which itself can employ a linear prediction model in respect of the non-linear input signal. Thus, unlike the prior art, which treats the physical model as linear while attempting to compensate for any non-linearities in the Kalman filter, embodiments of the invention instead perform the non-linear processing up front prior to input of a non-linear version of the input signal to the Kalman filter. Age in this context means the time the crystal oscillator has been running.

It will thus be understood that herein reference to a "non-linear model" refers to the fact that the Kalman filter receives as an input a non-linearized version of the measured input variable as distinct from a Kalman filter wherein the prediction matrix incorporates higher order terms. A Kalman filter employing a non-linear model in accordance with embodiments of the invention may have a prediction matrix of the form:

$$\begin{bmatrix} 1 & f(x)_n & 0 \\ 0 & 1 & f(x)_n \\ 0 & 0 & 0 \end{bmatrix}$$

where $f(x)_n$ is a function generated by a function module upstream of the Kalman filter and which in the preferred embodiment for the aging module is a logarithmic function. However, it will be appreciated that if it were determined that the aging function of a particular type of OCXO could be more accurately represented by another function, such as an exponential function, then the function module could be an exponential module.

According to the present invention there is provided a compensation circuit for an oven-controlled crystal oscillator serving as a reference for a phase-locked loop in holdover mode, said phase-locked loop being locked to a primary reference in normal mode, said compensation circuit comprising a temperature sensor for producing a temperature signal representative of the oven-controlled crystal oscillator temperature; a time counter for generating an aging signal representative of the time the oven-controlled crystal oscillator has been in use; an input responsive to frequency drift of said oven-controlled crystal oscillator; a non-linear function module for generating a modified aging signal that is a non-linear function of said aging signal; a first Kalman filter for generating an estimate of said frequency drift based on said temperature signal; a second Kalman filter for generating an estimate of said frequency drift based on said modified aging signal; and a combining and comparing module for combining said estimates generated by said first and second Kalman filters and comparing said estimates with said frequency drift to produce an error signal to update in normal mode said first and second Kalman filters, said first and second Kalman filters generating an error signal to correct for said oscillator frequency drift during holdover mode due to temperature and aging effects based on based on updates obtained during operation of said phase-locked loop in normal mode.

As noted in the case of the aging model, the function may be a logarithmic function, so the prediction matrix may be of the form:

$$\Phi_A = \begin{bmatrix} 1 & D_L & 0 \\ 0 & 1 & D_L \\ 0 & 0 & 1 \end{bmatrix}$$

wherein $\Phi_A$ is the prediction matrix, and $D_{Ln} = \log t_n - \log t_{n-1}$.

The relationship between frequency and age may approach linearity after a certain period of time. When this occurs, a linear model may be more appropriate. Thus, in accordance with one embodiment of the invention, an additional aging Kalman filter is providing in addition to the normal aging Kalman filter. This additional Kalman filter may assume a linear model in accordance with the prior art and thus be directly coupled to the time counter, or at least coupled through linear circuits.

The additional Kalman filter is trained in parallel with the first mentioned aging Kalman filter until the relationship approaches linearity, at which point the additional Kalman filter takes over from the first-mentioned Kalman filter, which can then be disabled.

In one embodiment, the additional Kalman filter takes over when $D_{Ln} = \log t_n - \log t_{n-1}$ falls below a predetermined threshold.

According to another aspect of the invention there is provided a computer-implemented method of compensating an oven-controlled crystal oscillator serving as a reference for a phase-locked loop in holdover mode, said phase-locked loop being locked to a primary reference in normal mode, the method comprising: producing a temperature signal representative of the crystal oscillator temperature; generating an aging signal representative of the time the crystal oscillator has been in use; generating a modified aging signal that is a non-linear function of said aging signal; detecting a frequency drift of said crystal oscillator based on the output of said phase-locked loop; generating an estimate of said frequency drift based on said temperature signal in a first Kalman filter; generating an estimate of said frequency drift based on said modified aging signal in a second Kalman filter; combining said estimates generated by said first and second Kalman filters and comparing said estimates with said detected frequency drift to produce an error signal in normal mode to update in normal mode said first and second Kalman filters; and generating an error signal from said Kalman filters to compensate for said oscillator frequency drift during holdover mode based on updates obtained during operation of said phase-locked loop in normal mode.

In a still further aspect of the invention there is provided a compensation circuit comprising a Kalman filter for deriving an estimate of an observed variable; a sensor for measuring a second variable correlated in a non-linear relationship with said observed variable; and a non-linear function module for generating a modified signal bearing said non-linear relationship with said second variable for input to said Kalman filter.

BRIEF DESCRIPTION OF THE DRAWINGS

This invention will now be described in more detail, by way of example only, with reference to the accompanying drawings, in which:—

DETAILED DESCRIPTION OF PREFERRED EMBODIMENTS

Figure 1:
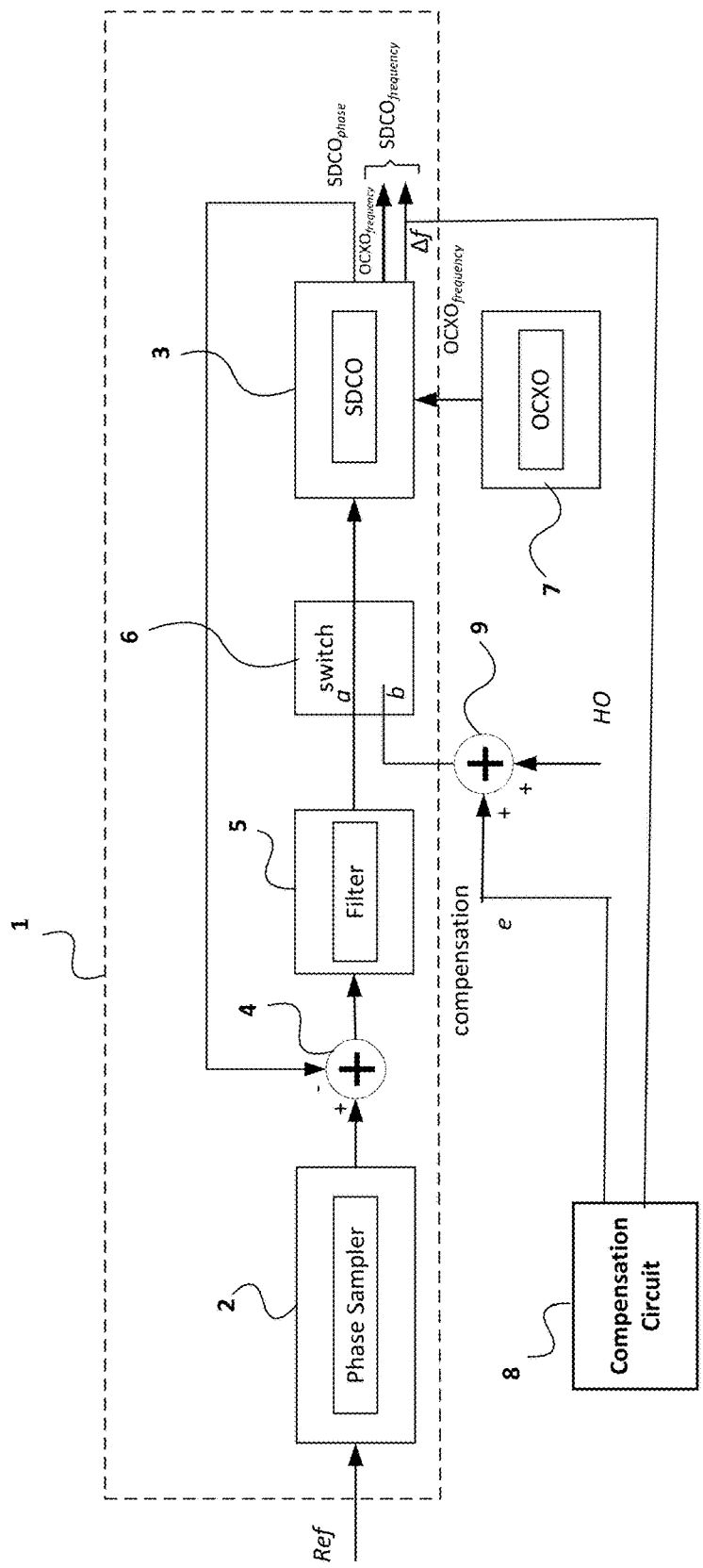
FIG. 1 is a block diagram of a DPLL incorporating a compensation circuit in accordance with an embodiment of the invention.

In FIG. 1, DPLL 1 comprises a phase sampler 2 that outputs a digital representation of a reference signal Ref from a primary source, such as a GPS signal. Software digital controlled oscillator (SDCO) 3 outputs digital representations of phase and frequency, namely $SDCO_{phase}$ and $SDCO_{frequency}$. $SDCO_{phase}$ is fed back to adder 4 (with a minus input), where it is compared with the phase of the reference signal Ref to provide an input to loop filter 5. This in turn generates a control signal that in normal mode is passed through switch 6, in the a position, to the SDCO 3 to adjust its output frequency $SDCO_{frequency}$ such that it is locked in phase with the input signal Ref.

OCXO 7 generates a frequency $OCXO_{frequency}$ that is required for the SDCO 3 to function. Although nominally having a certain value, in practice $OCXO_{frequency}$ varies slightly with temperature and age of the OCXO 7. Age in this context means the amount of time, typically measured in days, that it has been running since start-up.

The output frequency of the SDCO 3 $SDCO_{frequency}$ contains two components, namely a first component corresponding to $OXCO_{frequency}$, and a second component $\Delta f$ corresponding to an offset between $OCXO_{frequency}$ and the actual output frequency $SDCO_{frequency}$ of the DPLL 1.

Initially, in the absence of an input reference, the DPLL 1 will free run at a frequency corresponding to $OCXO_{frequency}$. In other words the offset $\Delta f$ will be zero. When lock to the input reference Ref is first achieved, $\Delta f$ will represent the offset required to maintain lock between the current frequency of the OCXO 7, $OCXO_{frequency}$, and the input frequency Ref. Assuming the primary reference is stable, any subsequent variation in the offset $\Delta f$ will result from the frequency drift of the OCXO 7 due to temperature and aging effects. In one embodiment this varying offset $\Delta f$ component of the output frequency $SDCO_{frequency}$ is used in normal mode as the input to the compensation circuit 8. In an alternative embodiment, the output frequency $SDCO_{frequency}$ can be used as the input to compensation circuit 8 since the latter will only respond to the varying component of the output frequency $SDCO_{frequency}$. The compensation circuit 8 is trained during normal mode in a manner to be described.

When the primary reference is lost the DPLL 1 goes into holdover mode and the OCXO 7 takes over from the primary reference to provide a back up reference until the primary reference can be restored. Sometimes, in the case of remote cell phone towers, where, for example, there has been a lightning strike damaging the GPS antenna, the DPLL 1 can remain in holdover mode for a matter of days. The compensation circuit 8 adjusts the control frequency of the SDCO 3 to take into account temperature and aging effects.

When a switch to the holdover mode occurs, the switch 6 is moved to the b position, and a control input from the adder 9 is applied to the input of the SDCO 3 in place of the output of the loop filter 5. A predetermined set holdover frequency HO is selected based on the past performance of the DPLL 1. The holdover frequency HO may, for example, be a long term average of the filtered SDCO frequency $SDCO_{frequency}$ during normal operation. Alternatively, it may be desirable to store several values, such as one minute ago, two minutes ago, and five minutes ago, without limitation because often complete failure of the primary reference is preceded by instability and a set holdover frequency HO based on the state of the system say five minutes ago may be more reliable than the frequency immediately before failure.

The set frequency HO based on the DPLL 1 output frequency of, for example, five minutes ago does not of course take into account the subsequent variation in frequency of the OCXO 7 due to the temperature and age effects discussed. The purpose of the compensation circuit 8 is to compensate for these effects. An error e predicted by the compensation circuit 8 based on the current temperature and age of the OCXO 8 and the past training during normal mode is added in adder 9 to the set holdover frequency HO in order to ensure that the actual current output frequency SDCO$_{frequency}$ is, as far as possible, maintained at the same output frequency as the output frequency of the SDCO 3 at the time the set holdover frequency HO was determined (say from 5 minutes ago) despite any subsequent variation in the frequency of the OCXO 7.

Figure 2:
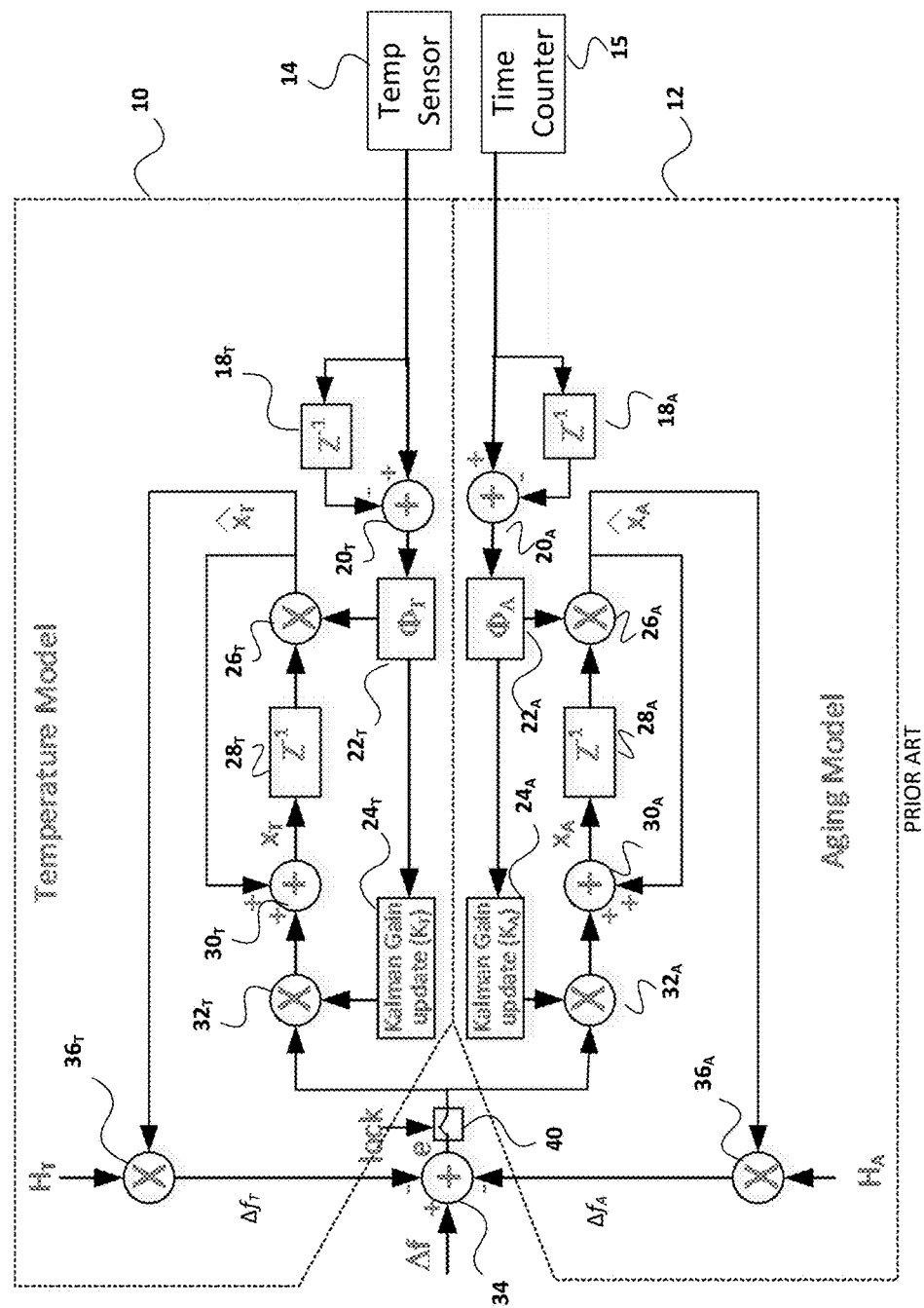
FIG. 2 is a functional block diagram of a prior art compensation circuit

A prior art compensation circuit for an OCXO 7 shown in FIG. 2 comprises two separate Kalman filters 10, 12 based on a temperature model and an aging model respectively. It will be understood that the entire circuit illustrated is digital and operates in discrete cycles determined by a system clock (not shown).

The compensation circuit shown in FIG. 2 comprises a temperature sensor 14 for sensing the temperature of the OCXO 7, the output of which is input to the Kalman filter 10 and a time counter, or timer 15, which is input to the Kalman filter 12.

As can be seen the Kalman filter 12 corresponding to the aging model contains similar elements to the Kalman filter 10 except that they operate on an age variable (time) rather than the temperature variable. Unless otherwise indicated, it can be assumed that the discussion relating to one Kalman filter applies to the other with the appropriate variable substituted. Since the Kalman filters 10, 12 contain similar components, but operating on different variables, namely temperature T and age A (time), like reference numerals will be employed, subscripted T and A respectively.

During normal operation of the DPLL 1, with switch 40 in the closed position as shown in FIG. 2, responsive to an active lock signal, the output of the temperature sensor 14 is applied through a differentiator comprising unit delay module 18$_T$ and adder 20$_T$ to state prediction matrix module 22$_T$ comprising a memory storing the prediction matrix $\Phi_T$, the outputs of which are applied to Kalman gain update module 24$_T$ and to one input of multiplier 26$_T$, the other input of which receives the output of unit delay module 28$_T$.

The output of multiplier 26$_T$ is applied to one input of adder 30$_T$, the output of adder 30$_T$ providing state vector $x_T$ as an input to unit delay module 28$_T$. The other input of the adder 30$_T$ receives the output of multiplier 32$_T$ whose inputs receive respectively the output of Kalman gain update module 24$_T$ and error e from the combining and comparing module in the form of adder 34 through closed switch 40. The state vector $x_T$ as applied to unit delay module 28$_T$ is the current estimated state vector $\hat{x}_T$ to which is added the error e modified by the Kalman gain $K_T$.

The output of the multiplier 26$_T$, which represents current estimated state vector $\hat{x}_T$, is additionally fed to one input of multiplier 36$_T$ whose other input receives the temperature observation matrix $H_T$. The output of the multiplier 36$_T$ gives the predicted value $\Delta f_T$ of variation in the observed value of frequency drift $\Delta f$ due to the temperature contribution.

The output of multiplier 36$_T$ is applied to a minus input of adder 34, which receives at its positive input the frequency offset frequency $\Delta f$ from the SDCO 3, which is representative of the frequency drift of the OCXO 7.

The output of multiplier 36$_A$ is input to the second minus input of adder 34, which in normal mode outputs to the Kalman filters 10, 12 the error e between the frequency difference $\Delta f_T + \Delta f_A$ as predicted by the Kalman filters 10, 12 and observed frequency drift $\Delta f$.

The observation matrices $H_T$ and $H_A$ when multiplied by the current estimated state vectors $\hat{x}_T$ and $\hat{x}_A$ for sample k give a prediction of the observed variable, in this case the frequency drift $\Delta f$. The state vector is:

$$\begin{bmatrix} \Delta f \\ \frac{d}{dt}\Delta f \\ \frac{d^2}{dt^2}\Delta f \end{bmatrix}$$

so the observation matrices $H_T$ and $H_A$ are each simply [1, 0, 0]

because performing matrix multiplication on the observation matrix and state vector leaves only the predicted observed variables $\Delta f_T$, $\Delta f_A$.

The prediction matrix module 22$_A$ comprises a memory storing the prediction matrix $\Phi_A$, which represents the prediction model for aging, i.e. frequency variation with respect to time. The time signal from the timer 15 is applied through a differentiator comprising unit delay module 18$_A$ and adder 20$_A$ to prediction matrix module 22$_A$.

Prediction matrix module 22$_A$ outputs a prediction value, which is then multiplied in multiplier 26$_A$ by the state vector $x_A$ delayed by one sample in unit delay module 28$_A$ to give the current estimated state vector $\hat{x}_A$.

Mathematically, this arrangement is represented by the equation $$\hat{x}_{An} = \Phi_{An} x_{A(n-1)}$$

where the subscript n represents the sample number.

The Kalman gain $K_A$ output by module 24$_A$ is multiplied in multiplier 32$_A$ by the error e derived from the current frequency drift $\Delta f$ and the sum of the estimated frequency drifts $\Delta f_T$ and $\Delta f_A$ obtained from the Kalman filters 10, 12 to determine the weight to be attached to the estimated error e. The weighted error e is added to the current estimated state vector $\hat{x}_A$ in the adder 30$_A$ to give the state vector $x_A$, which when delayed by one clock cycle or sample in the unit delay module 28$_A$ gives the new estimated state vector $\hat{x}_A$.

The output of the prediction matrix module 22$_A$ is also used to update the Kalman gain module 24$_A$ for the current clock cycle during normal operation of the DPLL 1.

As noted, the output of the multiplier 26$_A$ gives the expected for the state vector $\hat{x}_A$, which is multiplied by the observation matrix $H_A$ to derive the current estimate of the frequency deviation $\Delta f$ based on the aging model. As indicated above, a similar procedure is performed by the Kalman filter 10 based on the measured temperature.

Figure 3:
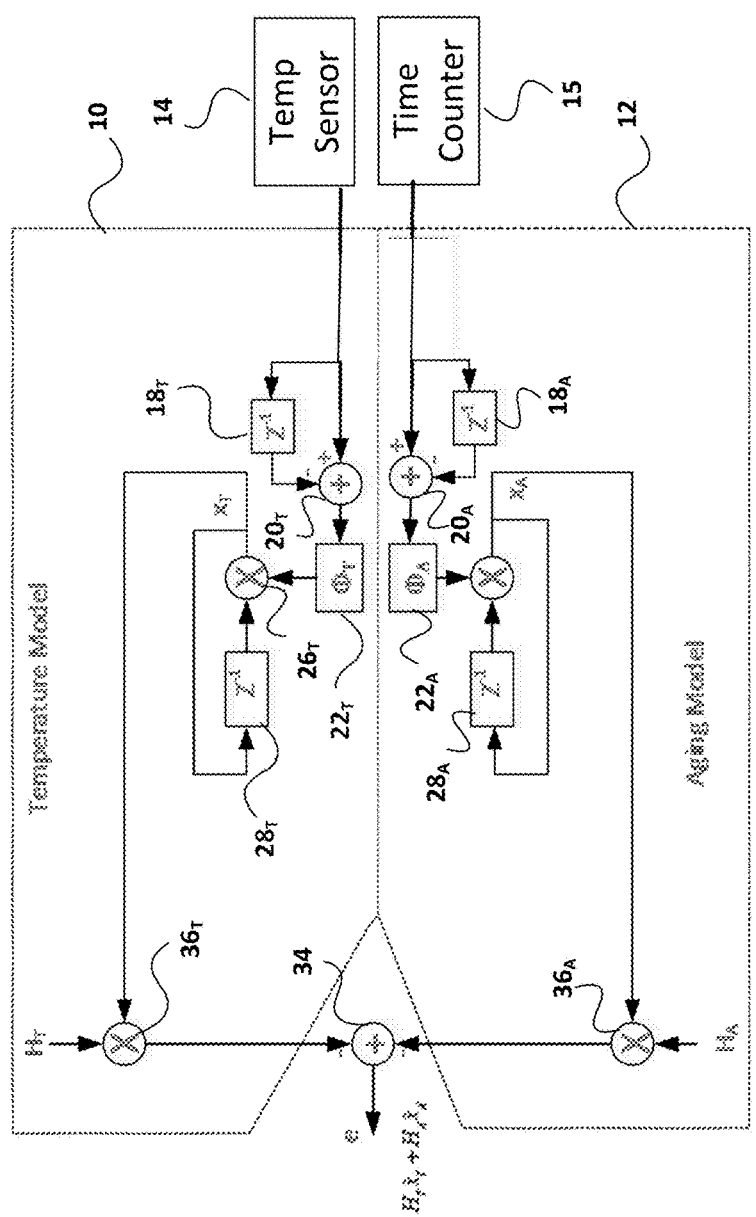
FIG. 3 is a functional equivalent block diagram of a prior art compensation circuit in prediction mode.

When the primary reference to the DPLL 1 is lost, the lock signal becomes inactive, and the DPLL 1 goes into holdover mode where the OXCO 7 provides the reference frequency until the primary reference can be restored. The switch 40 is opened responsive to the inactive lock signal, and the compensation circuit 8 functions as illustrated in FIG. 3. In FIG. 3, the Kalman gain update modules 24$_T$, 24$_A$, have been omitted as their outputs are of no effect since the input to the multipliers 32$_T$, 32$_A$ is zero when lock signal is inactive.

Additionally, the adders $30_T$, $30_A$ have been omitted since the input from multipliers $32_T$, $32_A$ is zero, so the state vectors $\hat{x}_T$, $\hat{x}_A$ which have already been modified by the Kalman gains determined during training in normal mode, are directly applied through unit delay modules $28_T$, $28_A$ to the inputs of the multipliers $26_T$, $26_A$.

The current estimates of the state vectors $\hat{x}_T$, $\hat{x}_A$ are multiplied by the respective observation matrices to produce the predictions $\Delta f_T$ and $\Delta f_A$ of the current frequency drift due to temperature and aging respectively, and which are both applied to the respective minus inputs of the adder 34 to produce the error signal e that is used in holdover mode to compensate for the frequency drift of the OCXO 7 in accordance with the equation $$e = H_T \hat{x}_T + H_A \hat{x}_A$$

In this state, the Kalman gains inherent in the expected state vectors $\hat{x}_T$, $\hat{x}_A$ are no longer updated, but remain at the values they had at the time of switchover to the holdover state. The aging prediction matrix used by Nicholls and Carleton is as follows:

$$\begin{bmatrix} 1 & \Delta A & 0 \\ 0 & 1 & aTT\Delta A \\ 0 & 0 & 0 \end{bmatrix}$$

where aTT is a constant. Multiplying this by the state vector $$\begin{bmatrix} \Delta f \\ \dfrac{d}{dt}\Delta f \\ \dfrac{d^2}{dt^2}\Delta f \end{bmatrix}$$

results in a new state vector $$\begin{vmatrix} \Delta f + \Delta A \dfrac{d}{dt}\Delta f \\ \dfrac{d}{dt}\Delta f + aTT\Delta A \dfrac{d^2}{dt^2}\Delta f \\ 0 \end{vmatrix}$$

This is a linear model, which the applicants have found does not reflect reality as the frequency deviation with age is not a linear function. U.S. Pat. No. 6,711,230 suggests treating the aging function within the Kalman filter as a polynomial of the form:

$$aA + bA^2 + cA^3 \ldots$$

Including the second order term gives a prediction matrix of the form $$\begin{bmatrix} 1 & \Delta A & \dfrac{\Delta A^2}{2} \\ 0 & 1 & V_t\Delta A \\ 0 & 0 & 1 \end{bmatrix}$$

which is based on a second derivative aging model. The implementation of a non-linear Kalman filter is complex and a poor representation of reality since it only includes second order terms. The more terms of higher order that are included, the more accurate the prediction model becomes, but at the same time the more complex the Kalman filter becomes.

Contrary to the assumption in the prior art, the applicants have found that the variation of frequency with age departs substantially from the linear model and the use of second order terms within the Kalman filter itself does not adequately represent reality.

Moreover, non-linear Kalman filters are complex to implement, especially if higher order terms are included.

In reality it appears that the aging function is highly non-linear and is more closely approximated by a logarithmic function, namely the frequency variation is of the form:

$$\Delta f = A \log(B^* t + C)$$

where A, B and C are unknown parameters.

Figure 4:
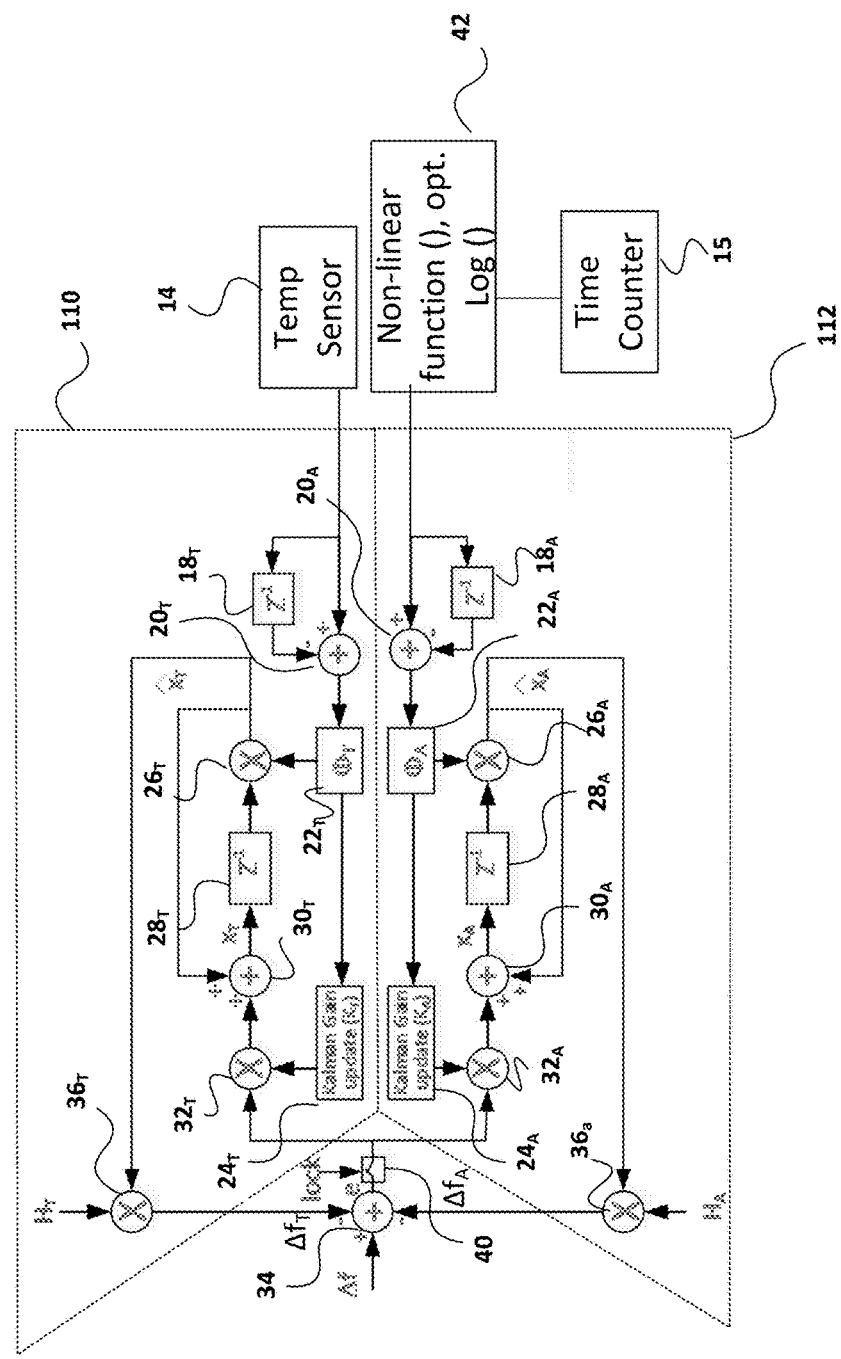
FIG. 4 is a functional block diagram of a compensation circuit in accordance with a first embodiment of the invention.

In the embodiment of the invention shown in FIG. 4, instead of applying the aging signal from time counter 15 directly to the input of the Kalman filter 12, as shown in FIG. 2, the applicants derive a logarithmic function of the aging signal A in non-linear log module 42, which is a specific example of a non-linear function module, and then apply log (A) as the input signal to the Kalman filter 112, where it is processed using the linear Kalman model inherent in the prediction matrix $\Phi_A$ stored in the prediction matrix module $22_A$. Thus, unlike the prior art, which contemplates the use of a non-linear model within the Kalman filter to account for non-linearities in the aging process, this embodiment employs Kalman filter 112 using a linear processing model operating on a non-linear function of the aging signal A, optionally a log function of the aging signal A. FIG. 4 thus represents an embodiment of compensation circuit 8 of FIG. 1.

Figure 5:
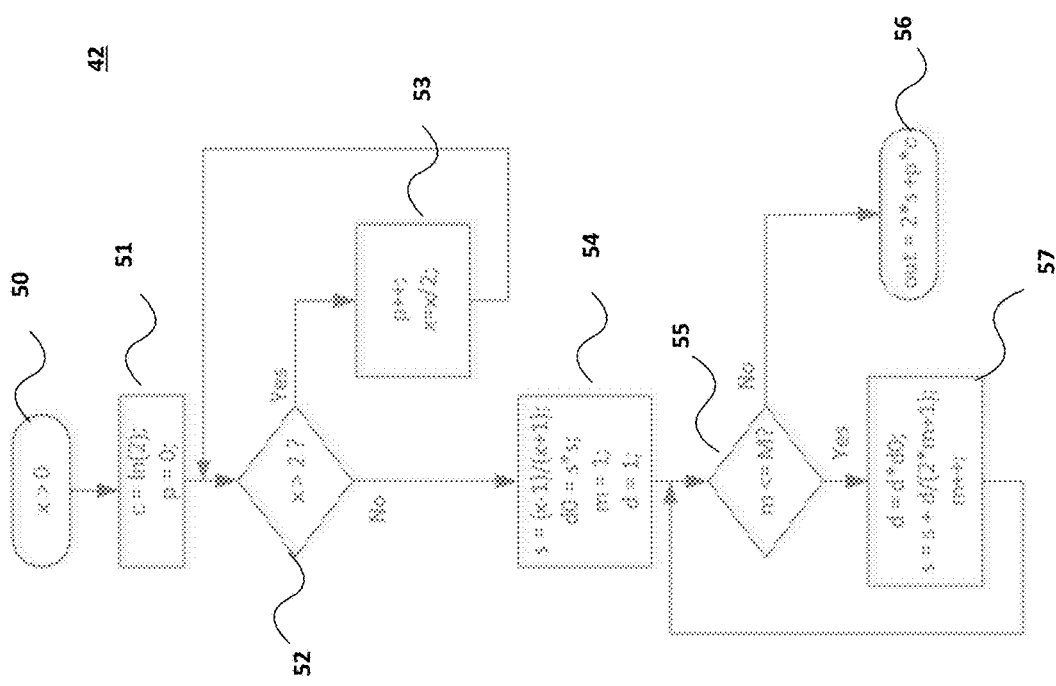
FIG. 5 is a flow chart illustrating an exemplary embodiment of the logarithmic module.

FIG. 5 shows an exemplary implementation of the log module 42, which, as previously noted is a specific example of what can be more generally termed a non-linear function module, in the form of a processor implementing the following algorithm. The algorithm uses an iterative approximation process as known in the art to derive the logarithm of an input variable x provided x is non-zero.

At step 50 a determination is made as to whether the value of current aging sample x>0, i.e. that it is non-zero. If yes, the constant c is set to ln(2), where ln is a natural logarithm, and the variable p is set to 0 at step 5. At step 52 a determination is made as to whether x is greater than 2; if yes, at step 53 p is incremented by one, x is set to x/2, and flow returns to step 52. If no, at step 54 variables is set to (x−1)/(x+1), d0 is set to s*s, variable m is set to 1, and variable d is set to 1.

At step 55 a determination is made as to whether m<=M, wherein M is the number of iterations required to achieve the desired degree of precision. The number of iterations M depends on the precision it is desired to achieve in a particular embodiment. For example, it turns out that in order to achieve a typical precision of say $10^{-6}$, 13 iterations are required, in which case M would be set at 13. If no, log module 42 generates the output out=2*s+p*c at step 56 for input to the Kalman filter 112, which is the logarithm of the input signal.

If yes, at step 57 d is set to d*d0, s is set to s+d/(2*m+1), m is incremented by one, and flow is returned to step 55.

In the Kalman filter 112 shown in FIG. 4, the aging prediction matrix $\Phi_A$ in prediction matrix module $22_A$ is of the form $$\Phi_A = \begin{bmatrix} 1 & D_L & 0 \\ 0 & 1 & D_L \\ 0 & 0 & 1 \end{bmatrix}$$

where $D_{Ln} = \log t_n - \log t_{n-1}$ and $t_n$ represents the time stamp at nth iteration of the chosen time interval, which could be measured in terms of seconds, minutes or hours, depending on the noise requirements. The prediction matrix $\Phi_A$ stored in the prediction matrix module $22_A$ is thus different from prediction matrix of the linear model of the prior art where $$D_{Ln} = t_n - t_{n-1}$$

The temperature prediction matrix $\Phi_T$ of Kalman filter 10 remains the same and is of the form:

$$\Phi_{Tn} = \begin{bmatrix} 1 & \Delta T_n & 0 \\ 0 & 1 & \Delta T_n \\ 0 & 0 & 1 \end{bmatrix}$$

with $\Delta T_n$ being the temperature changes between iteration n and iteration (n−1).

However, if non-linear behaviour of frequency vs temperature is observed, it will be appreciated that a similar arrangement can be used for the temperature Kalman filter by putting the temperature signal up front through a suitable function module so that the prediction matrix would become $$\begin{bmatrix} 1 & f(\Delta T)_n & 0 \\ 0 & 1 & f(\Delta T)_n \\ 0 & 0 & 0 \end{bmatrix}$$

The internal operation of the Kalman filters 10, 112, apart from the different prediction matrix in Kalman filter 112 is similar to the prior art shown in FIG. 2. More specifically the Kalman filters 10, 112 implement the following process in the Kalman update modules $24_T$, $24_A$ while in learning mode during normal operation of the DPLL 1:

Let the state vectors output by adders $30_T$, $30_A$ for the temperature and aging models, respectively, be $x_T$ and $x_A$. which, are initialized to $$\begin{bmatrix} 0 \\ 0 \\ 0 \end{bmatrix}.$$

The Kalman model update in each iteration is the well known Kalman filter iteration procedure at iteration n. The expectation values $\hat{x}_{Tn}$, $\hat{x}_{An}$ for $x_T$, $x_A$ are given by:

$$\hat{x}_{Tn} = \Phi_{Tn} x_{T(n-1)}$$

$$\hat{x}_{An} = \Phi_{Tn} x_{A(n-1)}$$

$$U_{Tn} = \Phi_{Tn} P_{T(n-1)} \Phi_{Tn}^T + Q_{Tn}$$

$$U_{An} = \Phi_{An} P_{A(n-1)} \Phi_{An}^T + Q_{An}$$

where $Q_{Tn}$ and $Q_{An}$ are the measured noise covariance matrix $$K_{Tn} = U_{Tn} H_T^T (H_T U_{Tn} H_T^T + R_{Tn})^{-1}$$

$$K_{An} = U_{An} H_A^T (H_A U_{An} H_A^T + R_{An})^{-1}$$

$R_{Tn}$ and $R_{An}$ are noise covariance matrix for the Kalman model, $K_{Tn}$ and $K_{An}$ are the Kalman gain, and $U_{Tn}$ and $U_{An}$ are intermediate variables.

$$e = \Delta f - H_T \hat{x}_{Tn} - H_A \hat{x}_{An}$$

$$x_{Tn} = \hat{x}_{Tn} + e \cdot K_{Tn}$$

$$x_{An} = \hat{x}_{An} + e \cdot K_{An}$$

$$P_{Tn} = (I - K_{Tn} H_T) U_{Tn}$$

$$P_{An} = (I - K_{An} H_A) U_{An}$$

where I is the identity matrix and the superscript means the transposition matrix. $P_{Tn}$ and $P_{An}$ are error covariance matrix As noted previously, the observation matrixes $H_T = H_A = [1, 0, 0]$. $P_{T0}$ and $P_{A0}$ are initialized as identity matrices. $Q_{Tn} = \sigma_{QTn} I$, $Q_{An} = \sigma_{QAn} I$, $R_{Tn} = \sigma_{RTn} I$ and $R_{An} = \sigma_{RAn} I$ are respective error covariance matrixes with initial values being chosen according to knowledge about the noise of the system, the input reference, and the temperature sensor 14. These error covariance matrices are updated by continuous learning during normal operation of the DPLL 1.

If a fixed-point implementation is used quantization noise needs to be considered. If there is almost no noise, initial values should be set to zero (or close to zero). However, this value may be numerically unstable with a fixed point or finite precision implementation, in which case the initial values should also take into account the numerical precision of the implementation.

Values for the initial noise covariance matrixes stored in the Kalman update modules $24_T$, $24_A$ can be chosen based on the system requirements. Typical, non-limiting, exemplary values would be:

$$\sigma_{QTn} = \sigma_{QAn} = \sigma_{RTn} = \sigma_{RAn} = 10^{-6}$$

Figure 6:
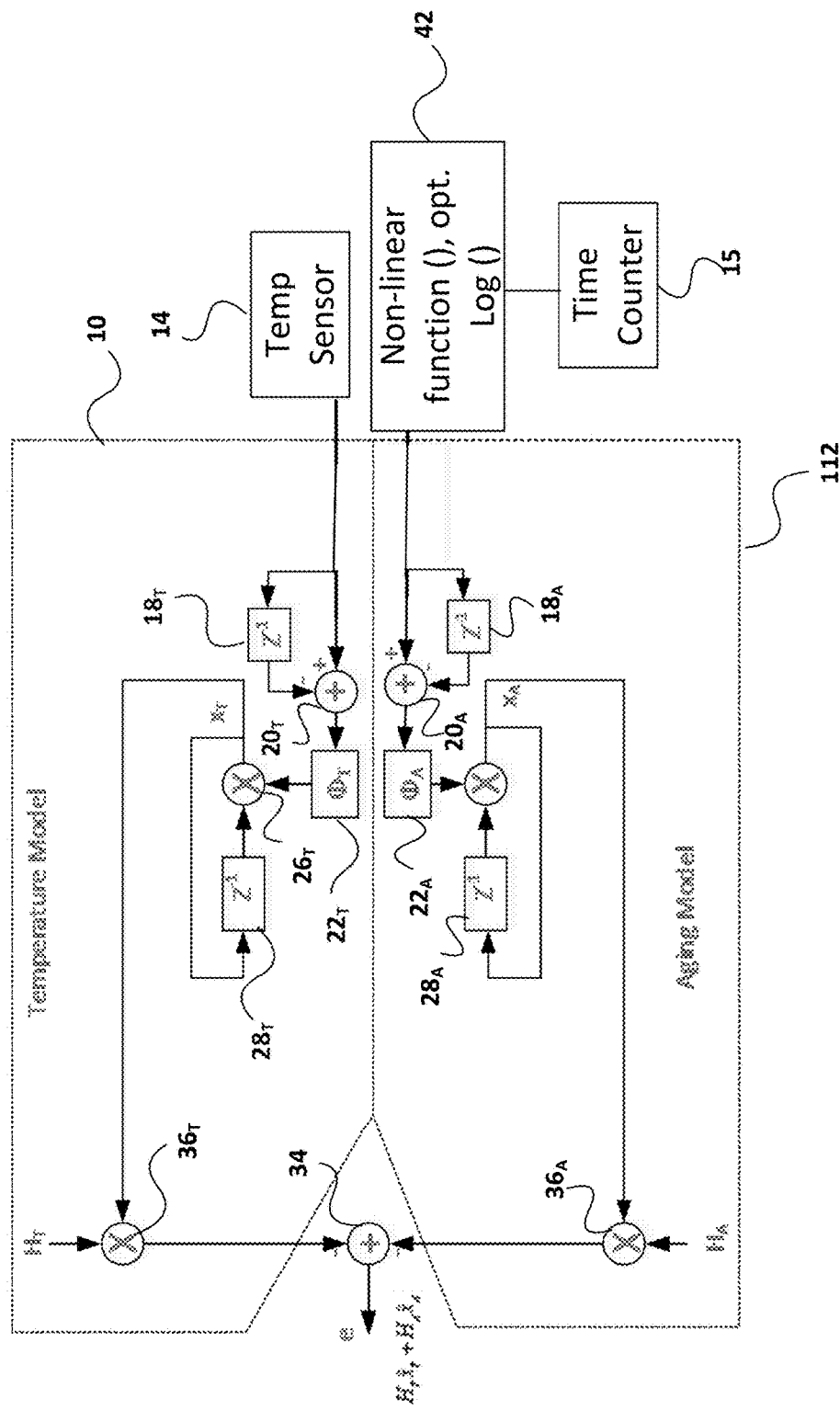
FIG. 6 is a functional equivalent block diagram of the compensation circuit in accordance with an embodiment of the invention in prediction mode.

When the reference clock is unavailable, and the DPLL 1 goes into the holdover mode, the switch 40 for the prediction error (e) will be in the open position. The Kalman filters 10, 112 remain in their prediction state without adjustment of the Kalman gains inherent in the state vectors as shown in FIG. 6, since in this state a zero is applied to the input of each of multipliers $32_A$, $32_T$. In this state, the Kalman gains embedded in the current estimates of state vectors $\hat{x}_T$, $\hat{x}_A$ remain at the values they had at the time the system went into holdover mode until such time as it returns to the normal mode and update of the Kalman gains resumes.

The combination output of temperature model and aging model $H_T \hat{x}_T + H_A \hat{x}_A$ will provide the prediction of OCXO 7 variation giving the error e output by compensation circuit 8 that is used to compensate the set holdover frequency HO of the OCXO 7 as shown in FIG. 1.

The non-linear model fits the XO aging variation better than the linear model so that it will have better compensation and hence improved holdover accuracy.

By way of example, assume the effect of aging is $5 * \ln(0.5 * t + 1)$ ppb/day, where ppb means parts per billion and t is time in units of one day.

If we assume that the holdover occurs at day 2 (t=2), adopting the non-linear model in accordance with embodiments of the invention and after two day's training, it is possible to meet a 1 μs phase movement target in one day's holdover time, namely from day 2 to day 3.

By comparison, adopting the linear model of the prior art, the phase movement during a one day holdover is approximately 10.8 μs.

The slope of the above log function is: 5*0.5/(0.5t+1)= 2.5/(0.5t+1)

The slope at day t=2 is 1.25 ppb/day, is the predicted value used for holdover. The maximum slope error happens at the end of one day: t=3 and the slope is 1 ppb/day. The average slope error is 0.125 ppb during one day in holdover mode (t=2 to t=3), so the phase movement in one day will be roughly 0.125*3600*24=10800 ns, or 10.8 μs.

In general, the improvement depends on: the XO aging curve; when the holdover happens; and the length of the holdover period.

Although the above embodiment works well initially, if the Kalman filter is updated with a constant time step Δt, $D_L$ ($D_L$=log(t+Δt)−log(t)) will approach zero as the time t becomes large. What is considered "large" depends on the precision of the implementation of the log function. Typically, this would be in the order of 30-60 days.

Using a fixed-point estimation process, a small value of $D_L$ will cause both an estimation and prediction error.

Figure 7:
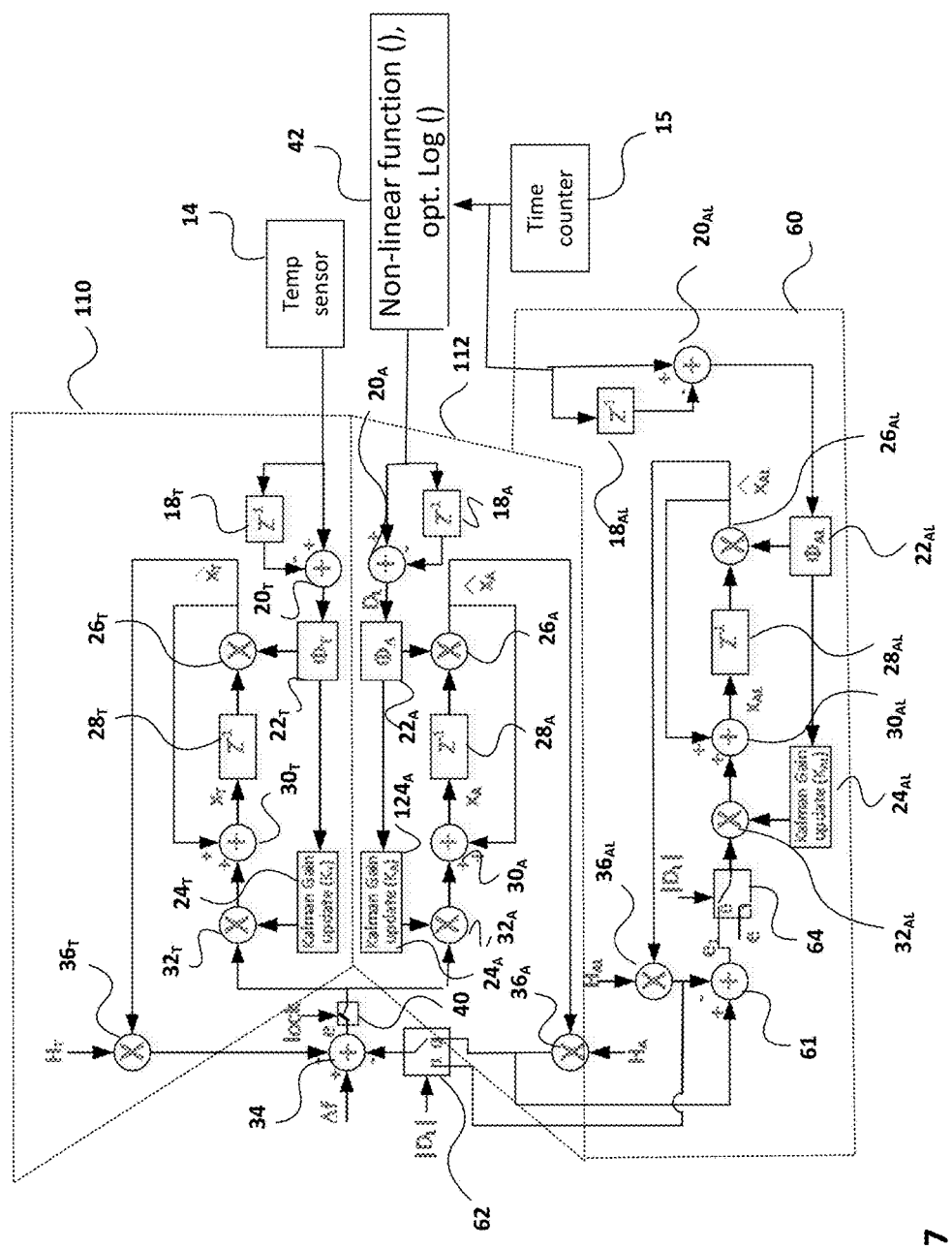
FIG. 7 is a functional block diagram of a compensation circuit in accordance with a second embodiment of the invention.

Also, as t becomes large, especially in the case where the required holdover period is fixed, for example, a predetermined number of hours, the aging function approaches a linear function. In such situation, the linear model works better than the non-linear model since it more accurately represents the actual aging function. In this case it is desirable to base a compensation circuit on a mixed model as shown in FIG. 7. This circuit makes a smooth transition between the non-linear model and the linear model as t becomes large.

The circuit shown in FIG. 7 has an additional aging Kalman filter 60 running in parallel with the main aging Kalman filter 112. Again like reference numerals are employed but subscripted AL for aging-linear.

The output of the time counter 15 is applied directly through the differentiator $18_{AL}$, $20_{AL}$ to the input of the state prediction module $22_{AL}$ without conversion to a non-linear function. It will be understood that the time counter 15 can be directly connected to the differentiator $18_{AL}$, $20_{AL}$, or passed through additional modules so long as, unlike the case for the Kalman filter 112, they are linear circuits.

In the normal operational mode of the DPLL 1, with switch 40 closed responsive to an active lock signal, when $|D_L|$ is greater than a threshold value, the switches 62, 64 are set to the zero position and the compensation circuit operates as described with reference to FIG. 4 except that a secondary error signal $e_1$ is derived in adder 61 to update the Kalman filter 60.

The additional Kalman filter 60 outputs from multiplier $36_{AL}$ an estimated observed frequency value for the current age. This estimated observed frequency value is compared in a comparator provided by adder 61 with the corresponding estimated observed frequency value output by the Kalman filter 112 to produce an error signal $e_1$, which is used to update the Kalman filter 60. As a result, the Kalman filter 60 is trained in parallel with the Kalman filter 112.

If the modulus of $D_L$ falls below a predetermined threshold, switches 62, 64 change to the 1 position. In this position the estimate of the observed frequency value from the additional aging Kalman filter 60, output from multiplier $36_{AL}$ is input to the adder 34 through switch 62 to generate the error signal e. The switch 64 is set to the 1 position to receive the error signal e from the output of adder 34 to update the additional aging Kalman filter 60. In this configuration the Kalman filter 60 is effectively substituted for the Kalman filter 112, which can stop being updated because it is no longer needed.

The switchover can occur in either normal mode or holdover mode of the phase locked loop. If the switchover occurs in normal mode, the subsequent operation of the circuit will be similar to the prior art described with reference to FIG. 2.

If the PLL goes into holdover mode before the switchover, the error signal will be initially be produced from Kalman filters 10, 112 as described with reference to FIG. 4.

If the switchover occurs in holdover mode, the Kalman filter 60 will initially be updated by the output from the Kalman filter 112. When switchover occurs, the Kalman filter 60 will take over from the Kalman filter 112 and generate an output based on the last updated value derived from the output of the Kalman filter 112.

The threshold for switching depends on the precision of Kalman update and number of bits used for the time stamp. With 32 bit time-stamp precision, the threshold can be set to between 2 and 5 least significant bits.

Figure 8:
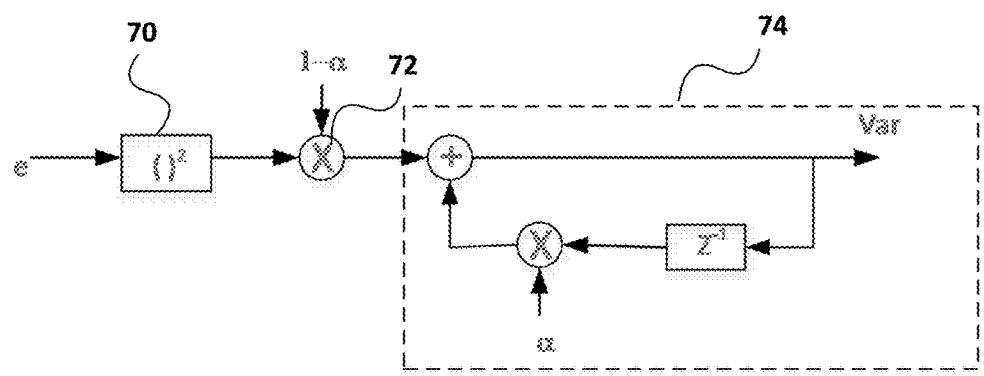
FIG. 8 is a functional block diagram of an error covariant matrix update circuit for use in the Kalman filters.

The Kalman gain update modules $24_T$, $24_A$, $24_{AL}$ contain the covariance matrices Q, R noted above, which are updated from observation error e using the circuit as shown in FIG. 8.

The error e is squared in block 70 and the result multiplied by 1−α in multiplier 72, where α is the filter coefficient. This value is passed through first order filter 74 to produce the output var.

In FIG. 8, the variance is distributed equally between the Kalman temperature model and the aging model, giving $$\sigma_{QTn} = \sigma_{QAn} = \sigma_{RTn} = \sigma_{RAn} = \text{Var}/2$$

which are used for respective noise covariance matrixes in the Kalman estimation.

The filter coefficient α can be chosen according the system target performance, required convergence time and quantization noise with fix point implementation. A non-limiting exemplary value would be 0.0001

For the additional aging Kalman filter 60, its error covariance matrix is updated with its own observation error $e_1$, and if the error variance update value is $\text{Var}_1$, the diagonal element in its noise covariance matrixes will be:

$$\sigma_{QALn} = \sigma_{RALn} = \text{Var}_1$$

The division by 2 is not required because there is only one Kalman model update for the background linear Kalman filter aging model.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor. Moreover, the term "circuit" includes any assembly of functional blocks whether implemented in software or hardware. It will also be understood that the term "adder" where used, unless otherwise indicated, also includes a subtractor in the sense that an adder can add a negative number, thereby resulting in a subtraction.

The invention claimed is:

1. A compensation circuit for an oven-controlled crystal oscillator serving as a reference for a phase-locked loop in holdover mode, said phase-locked loop being locked to a primary reference in normal mode, said compensation circuit comprising:
a temperature sensor for producing a temperature signal representative of the oven-controlled crystal oscillator temperature;
a time counter for generating an aging signal representative of the time the oven-controlled crystal oscillator has been in use;
an input responsive to frequency drift of said oven-controlled crystal oscillator;
a non-linear function module for generating a modified aging signal that is a non-linear function of said aging signal;
a first Kalman filter for generating an estimate of said frequency drift based on said temperature signal;
a second Kalman filter for generating an estimate of said frequency drift based on said modified aging signal; and
a combining and comparing module for combining said estimates generated by said first and second Kalman filters and comparing said estimates with said frequency drift to produce an error signal to update in normal mode said first and second Kalman filters,
said first and second Kalman filters generating an error signal to correct for said oscillator frequency drift during holdover mode due to temperature and aging effects based on updates obtained during operation of said phase-locked loop in normal mode.

2. The compensation circuit of claim 1, wherein said first and second Kalman filters are linear Kalman filters.

3. The compensation circuit of claim 1, wherein said non-linear function module is a logarithmic module.

4. The compensation circuit of claim 3, wherein said second Kalman filter has a memory storing a prediction matrix $\Phi_A$ of the form;

$$\Phi_A = \begin{bmatrix} 1 & D_L & 0 \\ 0 & 1 & D_L \\ 0 & 0 & 1 \end{bmatrix}$$

where $D_L$ is $D_{Ln} = \log t_n - \log t_{n-1}$ and $t_n$ represents the time stamp at nth iteration of the time interval t.

5. The compensation circuit of claim 4, wherein said logarithmic module comprises a processor computing a logarithmic function by an iterative approximation process.

6. The compensation circuit of claim 1, further comprising an additional aging Kalman filter coupled by linear circuitry to said time counter, said additional aging Kalman filter being switchably coupled to said aging Kalman filter to take over therefrom when a predetermined condition is met.

7. The compensation circuit of claim 6, wherein said additional aging Kalman filter comprises a comparator receiving at one input an estimate of observed frequency drift from said additional Kalman filter and at another input said estimate of the observed frequency drift from said first-mentioned aging Kalman filter to generate in a first state a secondary error signal to update said additional aging Kalman filter, and in a second state to generate said first-mentioned error signal for input to said additional aging Kalman filter.

8. The compensation circuit of claim 7, comprising a first switch, which in said first state, couples the estimate output by said aging Kalman filter to said comparing and combining module and in a second state couples an estimate output by said additional aging Kalman filter to said comparing and combining module, and a second switch, which in said first state couples said secondary error signal to said aging Kalman filter and in said second state couples said first mentioned error signal to said additional aging Kalman filter.

9. The compensation circuit of claim 8, wherein said first and second switches are configured to change from said first state to said second state as the relationship between frequency and age approaches linearity.

10. The compensation circuit of claim 8, wherein said first and second switches are configured to change from said first state to said second state when the modulus of $D_L$ falls below a predetermined value, where $D_L$ is $D_{Ln} = \log t_n - \log t_{n-1}$ and $t_n$ represents a time stamp at the nth iteration.

11. A computer-implemented method of compensating an oven-controlled crystal oscillator serving as a reference for a phase-locked loop in holdover mode, said phase-locked loop being locked to a primary reference in normal mode, the method comprising:
producing a temperature signal representative of the crystal oscillator temperature;
generating an aging signal representative of the time the crystal oscillator has been in use;
generating a modified aging signal that is a non-linear function of said aging signal;
detecting a frequency drift of said crystal oscillator based on the output of said phase-locked loop;
generating an estimate of said frequency drift based on said temperature signal in a first Kalman filter;
generating an estimate of said frequency drift based on said modified aging signal in a second Kalman filter;
combining said estimates generated by said first and second Kalman filters and comparing said estimates with said detected frequency drift to produce an error signal in normal mode to update in normal mode said first and second Kalman filters; and
generating an error signal from said Kalman filters to compensate for said oscillator frequency drift during holdover mode based on updates obtained during operation of said phase-locked loop in normal mode.

12. The method of claim 11, wherein said first and second Kalman filters are linear Kalman filters.

13. The method of claim 12, wherein said second Kalman filter has a stored prediction matrix $\Phi_A$ of the form;

$$\Phi_A = \begin{bmatrix} 1 & D_L & 0 \\ 0 & 1 & D_L \\ 0 & 0 & 1 \end{bmatrix}$$

where $D_L$ is $D_{Ln} = \log t_n - \log t_{n-1}$ and $t_n$ represents the time stamp at nth iteration of the time interval t.

14. The method of claim 11, wherein said non-linear function is a logarithmic function.

15. The method of claim 11, wherein an additional aging Kalman filter responsive to said aging signal is switchably coupled to said aging Kalman filter to take over therefrom when a predetermined condition is met.

16. The method of claim 15, comprising generating in a first state a secondary error signal to update said additional aging Kalman filter from an estimate of the frequency drift obtained from said additional Kalman filter and an estimate of the frequency drift obtained from said first-mentioned aging Kalman filter, and in a second state applying said first-mentioned error signal for input to said additional aging Kalman filter.

17. The method of claim 16, wherein the switch from said first state to said second state occurs when the relationship between frequency and age approaches linearity.

18. The method circuit of claim 17, wherein the switch from said first state to said second state occurs when the modulus of $D_L$ falls below a predetermined value, where $D_L$ is $D_{Ln} = \log t_n - \log t_{n-1}$ and $t_n$ represents a time stamp at the nth iteration.

19. A compensation circuit comprising:
a Kalman filter for deriving an estimate of an observed variable;
a sensor for measuring a second variable correlated in a non-linear relationship with said observed variable; and
a non-linear function module for generating a modified signal bearing said non-linear relationship with said second variable for input to said Kalman filter.

20. The compensation circuit of claim 19, further comprising an additional Kalman filter for deriving said estimate of said observed variable updatable in parallel with said first-mentioned Kalman filter, said additional Kalman filter receiving said unmodified second variable as an input, and said additional Kalman filter being operable to take over from said first-mentioned Kalman filter when a predetermined condition is met.

* * * * *